(12) United States Patent
Nebashi et al.

(10) Patent No.: US 9,478,309 B2
(45) Date of Patent: Oct. 25, 2016

(54) MAGNETIC-DOMAIN-WALL-DISPLACEMENT MEMORY CELL AND INITIALIZING METHOD THEREFOR

(71) Applicants: NEC Corporation, Tokyo (JP); TOHOKU UNIVERSITY, Miyagi (JP)

(72) Inventors: Ryusuke Nebashi, Tokyo (JP); Noboru Sakimura, Tokyo (JP); Tadahiko Sugibayashi, Tokyo (JP); Yukihide Tsuji, Tokyo (JP); Ayuka Tada, Tokyo (JP); Hiroaki Honjou, Tokyo (JP); Hideo Ohno, Miyagi (JP)

(73) Assignees: NEC CORPORATION, Tokyo (JP); TOHOKU UNIVERSITY, Miyagi (JP)

( * ) Notice: Subject to any disclaimer, the term of this patent is extended or adjusted under 35 U.S.C. 154(b) by 9 days.

(21) Appl. No.: 14/437,197

(22) PCT Filed: Sep. 13, 2013

(86) PCT No.: PCT/JP2013/075395
§ 371 (c)(1),
(2) Date: Apr. 21, 2015

(87) PCT Pub. No.: WO2014/065049
PCT Pub. Date: May 1, 2014

(65) Prior Publication Data
US 2015/0248939 A1      Sep. 3, 2015

(30) Foreign Application Priority Data

Oct. 25, 2012   (JP) .................................. 2012-235763

(51) Int. Cl.
| | |
|---|---|
| *G11C 19/08* | (2006.01) |
| *H01L 43/08* | (2006.01) |
| *G11C 11/16* | (2006.01) |
| *H01L 43/02* | (2006.01) |
| *G11C 11/18* | (2006.01) |

(52) U.S. Cl.
CPC .......... *G11C 19/0833* (2013.01); *G11C 11/16* (2013.01); *G11C 11/161* (2013.01); *G11C11/1675* (2013.01); *G11C 11/1677* (2013.01); *G11C 11/1697* (2013.01); *G11C 11/18* (2013.01); *H01L 43/02* (2013.01); *H01L 43/08* (2013.01)

(58) Field of Classification Search
CPC ...................................................... G11C 19/08
USPC ....... 365/48, 55, 62, 66, 74, 78, 80–93, 100, 365/130, 131, 148, 158, 171–173, 225.5
See application file for complete search history.

(56) References Cited

U.S. PATENT DOCUMENTS

| | | | |
|---|---|---|---|
| 2009/0080239 A1* | 3/2009 | Nagase | H01L 27/228 365/158 |
| 2010/0315854 A1 | 12/2010 | Suzuki et al. | |
| 2012/0069640 A1* | 3/2012 | Nagase | G11C 11/16 365/158 |

FOREIGN PATENT DOCUMENTS

| | | |
|---|---|---|
| JP | 2005-191032 | 7/2005 |
| JP | 2007-103663 | 4/2007 |

(Continued)

OTHER PUBLICATIONS

S. Fukami et al., Journal of Applied Physics, vol. 103, 07E718, (2008).
I.M. Miron et al., Nature, 476, 189 (2011).
L. Liu et al., Physical Review Letters 106, 036601 (2011).
International Search Report PCT/JP2013/075395 dated Nov. 19, 2013.

*Primary Examiner* — Harry W Byrne
(74) *Attorney, Agent, or Firm* — Young & Thompson

(57) ABSTRACT

Provided is a magnetic domain wall displacement memory cell, including a recording layer including a magnetic film, the recording layer including: a magnetization reversal region in which magnetization is reversible; and first and second magnetization fixed regions that supply a spin-polarized electron to the magnetization reversal region. The magnetic domain wall displacement memory cell is configured so that a first region in which magnetization reversal occurs due to a first current flowing in a direction parallel to a film surface of the recording layer and a first magnetic field component in the direction parallel to the film surface of the recording layer is formed, and a second region in which no magnetization reversal occurs is formed.

17 Claims, 8 Drawing Sheets

(56) References Cited

FOREIGN PATENT DOCUMENTS

| JP | 2009-099625 | 5/2009 |
|---|---|---|
| JP | 2009-252909 | 10/2009 |
| JP | 2012-039015 | 2/2012 |
| WO | 2009019948 | 2/2009 |
| WO | 2009093387 | 7/2009 |
| WO | 2012127722 | 9/2012 |

* cited by examiner

MAGNETIC-DOMAIN-WALL-DISPLACEMENT MEMORY CELL AND INITIALIZING METHOD THEREFOR

TECHNICAL FIELD

This invention relates to a magnetic domain wall displacement memory cell and an initialization processing method for the magnetic domain wall displacement memory cell.

BACKGROUND ART

A magnetic random access memory (MRAM) is a memory for storing information through use of the magnetization direction of a magnetic layer. The MRAM has been developed due to its desired characteristics such as a low-voltage operation, nonvolatility, a theoretically infinite rewrite frequency, and a high-speed operation.

In recent years, there has been proposed a magnetic domain wall displacement MRAM in which the magnetization reversal of a recording layer is induced and controlled with a torque that acts between the spin of an electron and the magnetic moment localized in a magnetic substance. The magnetization reversal is hereinafter referred to as "current-driven magnetic domain wall displacement". The magnetic domain wall displacement MRAM is disclosed in, for example, Patent Documents 1 to 5.

In the magnetic domain wall displacement MRAM, a magnetic domain wall displacement element is used as a memory element. FIGS. 1A and 1B are respectively a schematic plan view and a schematic sectional view of a typical magnetic domain wall displacement element. The magnetic domain wall displacement element includes a recording layer 10 in which a magnetic domain wall MW is displaced, and magnetic layers (first fixed layer 16 and second fixed layer 17) that are magnetically combined with the magnetization of the recording layer 10. The recording layer 10 includes a reversal region 13 in which the magnetization direction can be reversed and two fixed regions (first fixed region 11 and second fixed region 12) formed on both sides of the reversal region 13. The respective magnetization directions of the first fixed region 11 and the second fixed region 12 are fixed in directions opposite to each other. As a result, in the recording layer 10, the magnetic domain wall MW is formed at a boundary between any of the fixed regions and the reversal region 13. Note that, in FIGS. 1A and 1B, a read mechanism for reading the magnetization direction of the reversal region 13 is not shown.

In the magnetic domain wall displacement element, the magnetization direction of the reversal region 13, that is, the position of the magnetic domain wall MW is associated with stored data. The stored data is rewritten by displacing the magnetic domain wall MW so as to reverse the magnetization direction of the reversal region 13. In order to displace the magnetic domain wall, a write current is supplied in an in-plane direction in the recording layer 10. The magnetic domain wall MW is displaced in the recording layer 10 in accordance with the direction of conduction electrons carrying the write current.

Further, in Non Patent Document 1, it is theoretically suggested that, in the case where a perpendicular magnetization film having perpendicular magnetic anisotropy is used as a magnetization recording layer, the write current is reduced compared to the case of using an in-plane magnetization film having in-plane magnetic anisotropy. Thus, it is preferred that the perpendicular magnetization film be used as the magnetization recording layer (magnetic domain wall displacement layer) in the magnetic domain wall displacement MRAM.

Further, according to Non Patent Documents 2 and 3, there is reported a recent new technology for controlling the magnetization of a magnetic film by causing a current to flow through the magnetic film while applying an in-plane magnetic field thereto. This technology has advantages in that a magnetic layer for polarizing an electron is not required, and hence a structure is simple. The reversal phenomenon of magnetization is considered to be caused by either the Rashba field generated by a non-symmetrical three-layer structure formed of a heavy metal layer, a ferromagnetic layer, and an oxidized metal layer or the spin-current injection that occurs due to the spin Hall effect of the heavy metal layer, and has currently been discussed actively. The magnetization reversal is hereinafter referred to as "magnetization reversal induced by an in-plane magnetic field and an in-plane current".

Note that, the direction in which magnetization is finally directed by the "magnetization reversal induced by an in-plane magnetic field and an in-plane current" depends on the kind and lamination order of the heavy metal layer. Specifically, in the case where the ferromagnetic layer is laminated on the heavy metal layer made of Pt or the like, the magnetization is finally directed in a direction of ZXIXH, with a unit vector Z in a Z-direction, an in-plane magnetic field H, and an in-plane current I being respectively vectors. In this case, the X represents an outer product. Further, in the case where the ferromagnetic layer is laminated under the heavy metal layer made of Pt or the like, the magnetization is finally directed in a direction of −ZXIXH. Further, in the case where the ferromagnetic layer is laminated on the heavy metal layer made of Ta or the like, the magnetization is finally directed in the direction of −ZXIXH. Further, in the case where the ferromagnetic layer is laminated under the heavy metal layer made of Ta or the like, the magnetization is finally directed in the direction of ZXIXH. In the description below, for simplicity, the case where the ferromagnetic layer is laminated on the heavy metal layer made of Pt or the like is described. However, the lamination can be appropriately modified or changed.

PRIOR ART DOCUMENTS

Patent Document

Patent Document 1: JP-A-2005-191032
Patent Document 2: JP-A-2007-103663
Patent Document 3: JP-A-2009-099625
Patent Document 4: JP-A-2009-252909
Patent Document 5: JP-A-2012-039015

Non Patent Document

Non Patent Document 1: S. Fukami et al., JOURNAL OF APPLIED PHYSICS, VOL. 103, 07E718, (2008).
Non Patent Document 2: I. M. Miron et al., Nature, 476, 189 (2011).
Non Patent Document 3: L. Liu, et al., Phys. Rev. Lett. 106, 036601 (2011).

SUMMARY OF THE INVENTION

Problem to be Solved by the Invention

One role of a fixed layer of the related-art magnetic domain wall displacement MRAMs is to form (introduce) a magnetic domain wall in (into) a recording layer. The formation (introduction) of the magnetic domain wall in (into) the recording layer is hereinafter referred to as "initialization".

In order to perform initialization, in a typical magnetic domain wall displacement MRAM, fixed layers having different retention forces are laminated respectively on two fixed regions in a recording layer. In this case, the magnetization direction of only one of the fixed layers and only one of the fixed regions can be reversed, while the magnetization direction of the other fixed layer and the other fixed region can be maintained, through the application of a uniform external magnetic field having appropriate intensity. Specifically, the magnetization directions of the two fixed regions can be made opposite to each other. Thus, the fixed layer is one of important factors for initializing a magnetic domain wall displacement element.

However, the magnetic domain wall displacement element including the fixed layer has a problem in that a manufacturing process of the fixed layer is complicated. For example, there is a risk in that, when the fixed layer is processed, the recording layer is damaged by etching and the like, and the magnetic characteristics of the recording layer are changed, with the result that desired magnetic characteristics cannot be obtained. Further, the magnetic domain wall displacement element including the fixed layer has a risk in that a leakage magnetic field from the fixed layer may increase a write current value.

It is an object of this invention to provide a technology capable of making a fixed layer for initialization unnecessary in a magnetic domain wall displacement MRAM.

Means to Solve the Problem

According to a first aspect of this invention, there is provided a magnetic domain wall displacement memory cell, including a recording layer comprising a magnetic film, the recording layer including: a magnetization reversal region in which magnetization is reversible; and at least two magnetization fixed regions that supply a spin-polarized electron to the magnetization reversal region, in which the magnetic domain wall displacement memory cell is configured so that a first region in which magnetization reversal occurs due to a first current flowing in a direction parallel to a film surface of the recording layer and a first magnetic field component in the direction parallel to the film surface of the recording layer is formed, and a second region in which no magnetization reversal occurs is formed.

According to a second aspect of this invention, there is provided a magnetic domain wall displacement memory cell, including a recording layer comprising a magnetic film, the recording layer including: a magnetization reversal region in which magnetization is reversible; and at least two magnetization fixed regions that supply a spin-polarized electron to the magnetization reversal region, in which the magnetic domain wall displacement memory cell is configured so that: magnetization reversal in a first direction is induced into a third region due to a second current flowing in a direction parallel to a film surface of the magnetic film and a second magnetic field component in the direction parallel to the film surface of the magnetic film; and magnetization reversal in a second direction that is antiparallel to the first direction is induced into a fourth region due to a third current flowing in the direction parallel to the film surface of the magnetic film and a third magnetic field component in the direction parallel to the film surface of the magnetic film.

Effect of the Invention

According to the one embodiment of this invention, a fixed layer for initialization may be made unnecessary in a magnetic domain wall displacement MRAM using a perpendicular magnetization film. Thus, the manufacturing process may be simplified and an inexpensive magnetic domain wall displacement MRAM may be provided.

MODES FOR EMBODYING THE INVENTION

First Embodiment

Figure 2A:
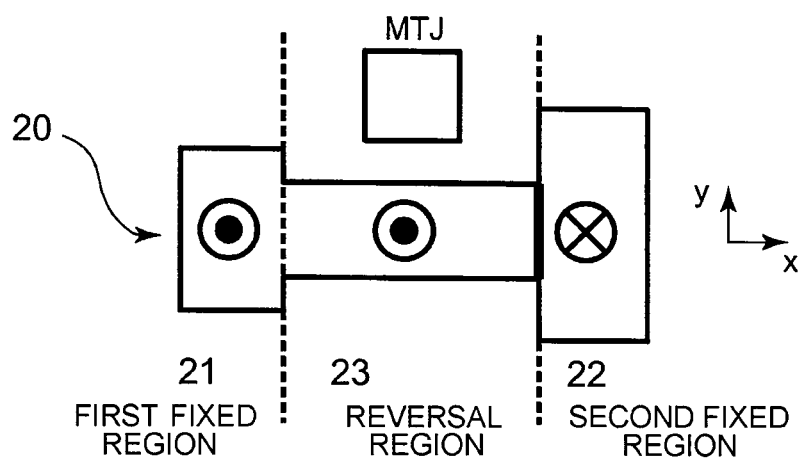
FIG. 2A is a plan view illustrating a configuration of a magnetic domain wall displacement element according to a first embodiment of this invention.
Figure 2B:
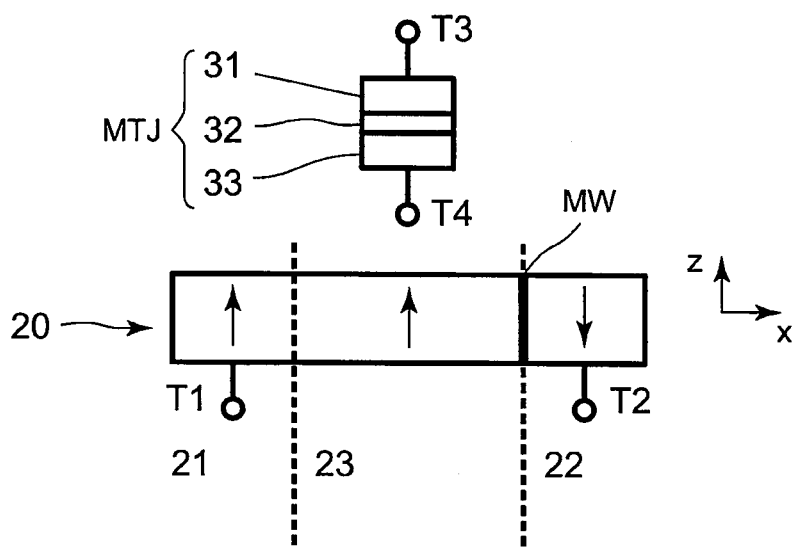
FIG. 2B is a vertical sectional view illustrating the configuration of the magnetic domain wall displacement element according to the first embodiment of this invention.

FIGS. 2A and 2B are respectively a schematic plan view and a schematic vertical sectional view of a magnetic domain wall displacement element according to a first embodiment of this invention. The magnetic domain wall displacement element according to the first embodiment includes a recording layer 20, which includes a reversal region (magnetization reversal region) 23 and a first fixed region 21 and a second fixed region 22 on both sides of the reversal region 23, a sense layer 31, a tunnel barrier layer 32, a reference layer 33, a first terminal T1, a second terminal T2, a third terminal T3, and a fourth terminal T4. Note that, a +Z-direction is defined as a direction perpendicular to a substrate (not shown) from a back surface to a front surface of the substrate as denoted by the arrow Z in FIG. 2B. An X-direction and a Y-direction are defined as horizontal directions perpendicular to a Z-direction as denoted by the arrows x and y in FIG. 2A. Further, the X-direction is defined as a longitudinal direction of the magnetic domain wall displacement element, and the Y-direction is defined as a direction perpendicular to the X-direction and the Z-direction. Further, the arrows in the recording layer 20 denote the magnetization direction of each magnetic layer. Further, as a magnetization state, an initial magnetization state is illustrated.

Figure 1A:
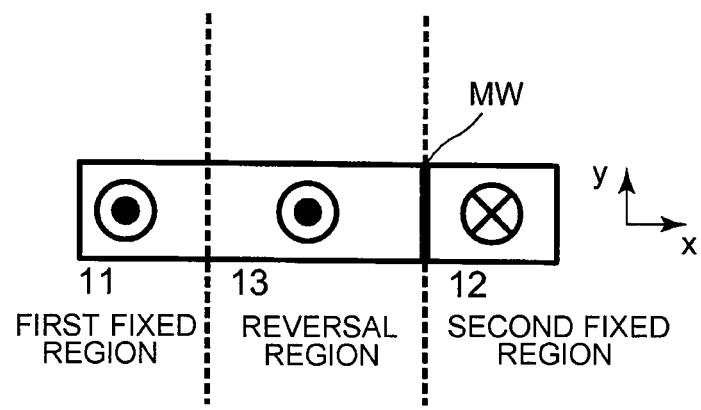
FIG. 1A is a plan view illustrating a configuration of a general magnetic domain wall displacement element.
Figure 1B:
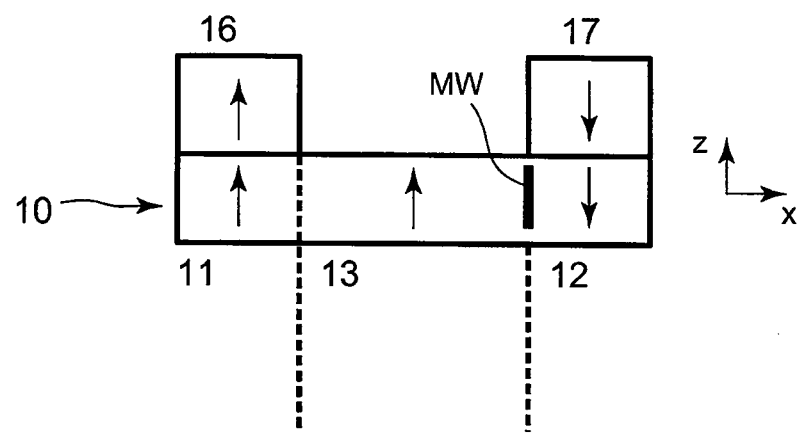
FIG. 1B is a vertical sectional view illustrating the configuration of the general magnetic domain wall displacement element.

The magnetic domain wall displacement element according to the first embodiment does not require a fixed layer, compared to the magnetic domain wall displacement element described in FIGS. 1A and 1B. Further, as is apparent from FIG. 2A, the width (size in the Y-direction) of the recording layer 20 varies in the reversal region 23, the first fixed region 21, and the second fixed region 22, and the density of a current flowing in the X-direction parallel to a film surface varies in the respective regions.

The recording layer 20 is formed of a ferromagnetic substance. More specifically, the recording layer 20 is formed of a perpendicular magnetization film having perpendicular magnetic anisotropy. It is desired that the material for the recording layer 20 contains at least one selected from Fe, Co, and Ni. As the recording layer 20, a Co/Ni laminated film, a Co/Pd laminated film, a Co/Pt laminated film, or a thin film having perpendicular magnetic anisotropy made of a Co—Cr—Pt alloy, a Co—Fe—B alloy, or the like is used. Further, it is desired that at least one of upper and lower layers (not shown) of the recording layer 20 be made of a heavy metal such as Pt, Pd, or Ta. Further, it is desired that the other of the upper and lower layers (not shown) of the recording layer 20 be made of an oxidized metal such as Mg—O or Al—O. With such a configuration, any phenomenon of the Rashba field generated by a non-symmetrical three-layer structure formed of a heavy metal layer, a ferromagnetic layer, and an oxidized metal layer or the spin-current injection that occurs due to the spin Hall effect of the heavy metal layer can be generated. Thus, it can be said that the first fixed region 21, the second fixed region 22, and the reversal region 23 in the recording layer 20 have the same film configuration.

The sense layer 31 is formed of a ferromagnetic substance. More specifically, the sense layer 31 is formed of an in-plane magnetization film having in-plane magnetic anisotropy. It is desired that the material for the sense layer 31 contains at least one selected from Fe, Co, and Ni. As the sense layer 31, a thin film having in-plane magnetic anisotropy made of a Ni—Fe alloy, a Co—Fe—B alloy, a Co—Fe alloy, or the like is used. The magnetization direction of the sense layer 31 can be changed to any one of a +Y-direction and a −Y-direction.

The reference layer 33 is formed of a ferromagnetic substance. More specifically, the reference layer 33 is formed of an in-plane magnetization film having in-plane magnetic anisotropy. The material for the reference layer 33 is the same as that for the sense layer 31. Note that, the magnetization of the reference layer 33 is fixed and is not changed by a write operation or a read operation. Therefore, for example, an antiferromagnetic layer (not shown) may be laminated on the reference layer 33. Further, the reference layer 33 may be a laminated film formed of a ferromagnetic layer, a non-magnetic layer, and a ferromagnetic layer. The magnetizations of the two ferromagnetic layers of the laminated film may be set so as to be antiparallel to each other by antiferromagnetic coupling.

The tunnel barrier layer 32 is formed of a non-magnetic layer. Preferably, the tunnel barrier layer 32 is formed of an insulating film, and examples of the material therefor include Mg—O, Al—O, Ni—O, and Hf—O. The tunnel barrier layer 32 is interposed between the sense layer 31 and the reference layer 33, and the sense layer 31, the tunnel barrier layer 32, and the reference layer 33 form magnetic tunnel junction (MTJ). Note that, the tunnel barrier layer may be made of a non-magnetic semiconductor or a metal material instead of the above-mentioned material.

The magnetic domain wall MW can be displaced in the recording layer 20. The recording layer 20 includes the first fixed region 21, the second fixed region 22, and the reversal region 23. The magnetization of the first fixed region 21 is held in the +Z-direction with the retention force of the recording layer 20 and is not changed by a write operation or a read operation. The magnetization of the second fixed region 22 is held in the −Z-direction with the retention force of the recording layer 20 and is not changed by a write operation or a read operation. The reversal region 23 is formed between the first fixed region 21 and the second fixed region 22, and the magnetization direction thereof can be changed to any one of the +Z-direction and the −Z-direction.

The first terminal T1 serves as a current terminal connected to the first fixed region 21. The second terminal T2 serves as a current terminal connected to the second fixed region 22. The third terminal T3 serves as a current terminal connected to the sense layer 31. The fourth terminal T4 serves as a current terminal connected to the reference layer 33. Note that, one of the first terminal T1 and the second terminal T2 may also serve as one of the third terminal T3 and the fourth terminal T4.

(Magnetization State of Data "0" and "1")

Figure 3A:
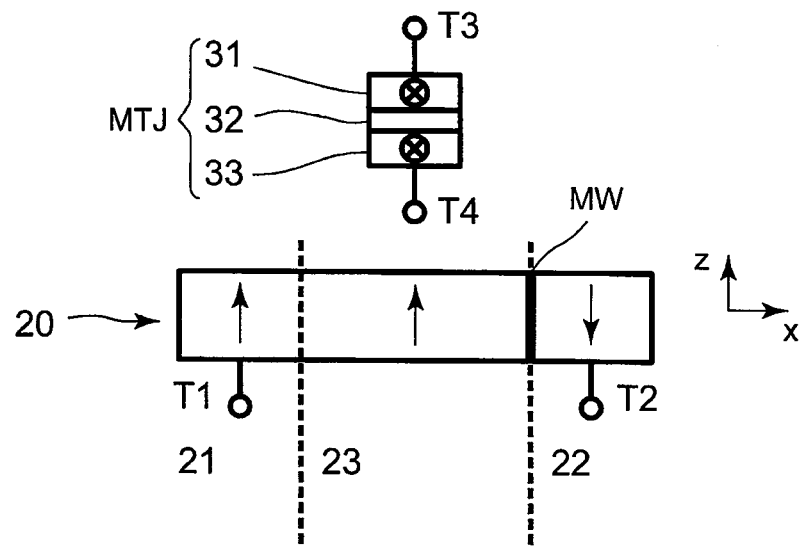
FIG. 3A is a conceptual diagram illustrating one magnetization state of the magnetic domain wall displacement element according to the first embodiment of this invention.
Figure 3B:
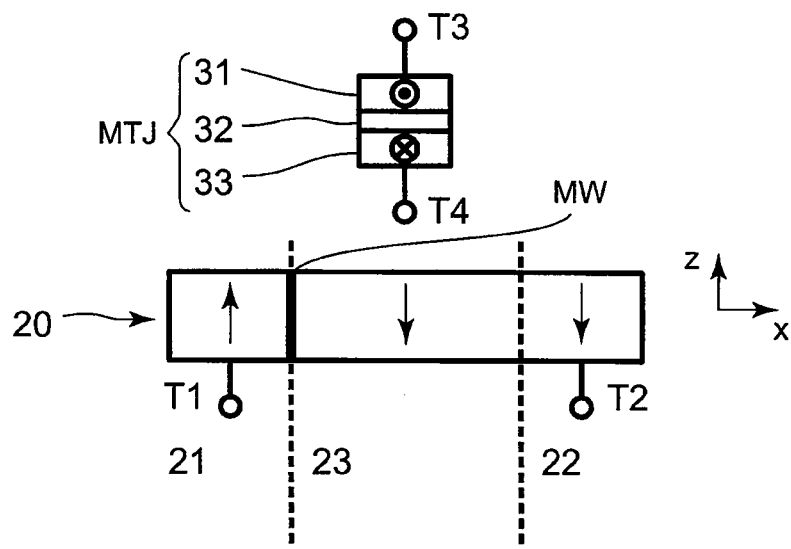
FIG. 3B is a conceptual diagram illustrating another magnetization state of the magnetic domain wall displacement element according to the first embodiment of this invention.

FIGS. 3A and 3B illustrate two magnetization states to be taken by the magnetic domain wall displacement element according to the first embodiment. The respective magnetization states are associated with stored data "0" and "1". As an example, the magnetization direction of the first fixed region 21 is held in the +Z-direction. The magnetization direction of the second fixed region 22 is held in the −Z-direction. The magnetization direction of the reference layer 33 is fixed in the +Y-direction (direction from the front side to the back side of the drawing sheet).

In the case where the magnetization of the reversal region 23 is in the +Z-direction as illustrated in FIG. 3A, the magnetic domain wall MW is formed at a position in the vicinity of a border between the reversal region 23 and the second fixed region 22. The leakage magnetic field from the reversal region 23 has a component in the +Y-direction at the position of the sense layer 31, and the magnetization of the sense layer 31 is directed in the +Y-direction in accordance with the direction of the leakage magnetic field. In this case, the magnetization of the sense layer 31 is parallel to the magnetization of the reference layer 33, and the resistance value of the MTJ becomes low (low-resistance state). The low-resistance state is associated with, for example, the data "0".

In the case where the magnetization of the reversal region 23 is in the −Z-direction as illustrated in FIG. 3B, the magnetic domain wall MW is formed at a position in the vicinity of a border between the reversal region 23 and the first fixed region 21. The leakage magnetic field from the reversal region 23 has a component in the −Y-direction at the position of the sense layer 31, and the magnetization of the sense layer 31 is directed in the −Y-direction in accordance with the direction of the leakage magnetic field. In this case, the magnetization of the sense layer 31 is antiparallel to the magnetization of the reference layer 33, and the resistance value of the MTJ becomes high (high-resistance state). The high-resistance state is associated with, for example, the data "1".

Note that, the magnetic domain wall MW located at a certain position in the recording layer 20 can continue to stay stably at that position as long as an external force is not applied. The reason for this is that an infinite number of pinning sites exist in a material having perpendicular magnetic anisotropy and have sufficient thermal stability.

(Write Operation)

Figure 4A:
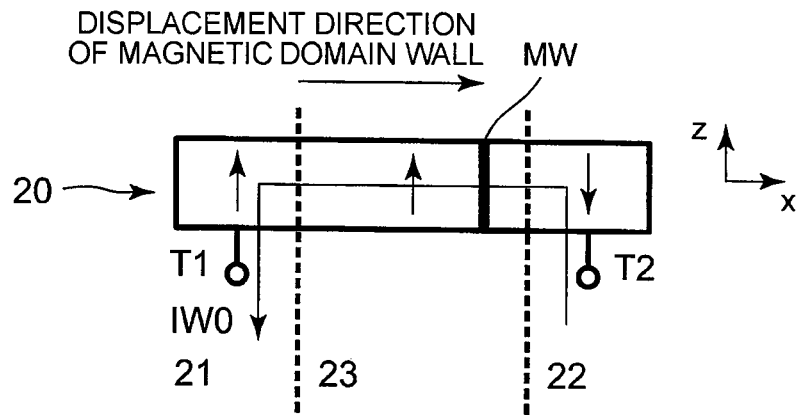
FIG. 4A is a conceptual diagram illustrating a data write operation with respect to the magnetic domain wall displacement element according to the first embodiment of this invention.
Figure 4B:
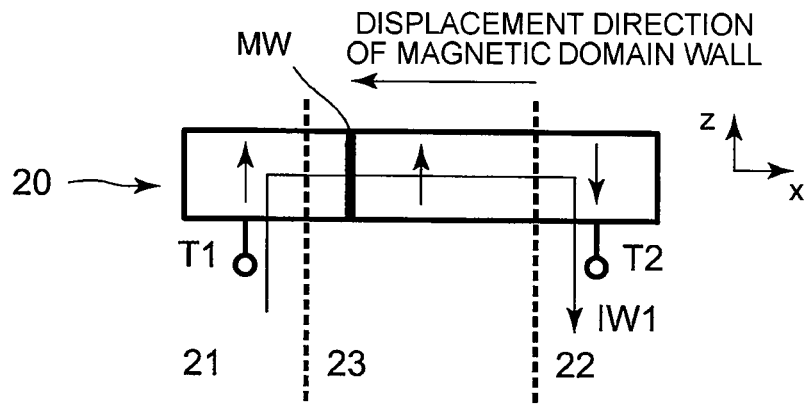
FIG. 4B is a conceptual diagram illustrating the data write operation with respect to the magnetic domain wall displacement element according to the first embodiment of this invention.

FIGS. 4A and 4B are conceptual diagrams illustrating a write operation of the magnetic domain wall displacement element according to the first embodiment. Note that, for convenience of the description, the MTJ is not shown. As an example, the magnetization direction of the first fixed region 21 is held in the +Z-direction. The magnetization direction of the second fixed region 22 is held in the −Z-direction. It is assumed that a write current value required for the magnetic domain wall MW to be displaced in the reversal region 23 is IW_TH0, a write current value required for the magnetic domain wall MW to be displaced in the first fixed region 21 is IW_TH1, and a write current value required for the magnetic domain wall MW to be displaced in the second fixed region 22 is IW_TH2. In the first embodiment, as illustrated in FIG. 2A, the width in the Y-direction of the reversal region 23, the first fixed region 21, and the second fixed region 22 varies, and hence the current density of the respective regions varies. Specifically, the width in the Y-direction of the reversal region 23 is the smallest, and hence the write current IW_TH0 required for driving the magnetic domain wall is the smallest. Next, the width in the Y-direction of the first fixed region 21 is the second smallest, and hence the write current IW_TH1 is the second smallest. Finally, the width in the Y-direction of the second fixed region 22 is the largest, and hence the write current IW_TH2 required for driving the magnetic domain wall is the largest. In this case, a relationship: current density of reversal region 23>current density of first fixed region 21>current density of second fixed region 22 is satisfied.

FIG. 4A illustrates a write current IW0 to be supplied for rewriting the data "1" into the data "0". The write current IW0 flows from the terminal T2 to the terminal T1 through the recording layer 20. In this case, a spin-polarized electron is injected from the first fixed region 21 to the reversal region 23. A spin of the injected electron drives the magnetic domain wall MW located at the border between the first fixed region 21 and the reversal region 23 toward the second fixed region 22. The magnitude of the write current IW0 is set to be larger than that of the write current IW_TH0 and smaller than that of the write current IW_TH1. As a result, the magnetic domain wall MW is displaced to the border between the second fixed region 22 and the reversal region 23, and the magnetization direction of the reversal region 23 is reversed into the +Z-direction.

FIG. 4B illustrates a write current IW1 to be supplied for rewriting the data "0" into the data "1". The write current IW1 flows from the terminal T1 to the terminal T2 through the recording layer 20. In this case, a spin-polarized electron is injected from the second fixed region 22 to the reversal region 23. A spin of the injected electron drives the magnetic domain wall MW located at the border between the second fixed region 22 and the reversal region 23 toward the first fixed region 21. The magnitude of the write current IW1 is set to be larger than that of the write current IW_TH0 and smaller than that of the write current IW_TH1. As a result, the magnetic domain wall MW is displaced to the border between the first fixed region 21 and the reversal region 23, and the magnetization direction of the reversal region 23 is reversed into the −Z-direction.

(Read Operation)

Figure 5:
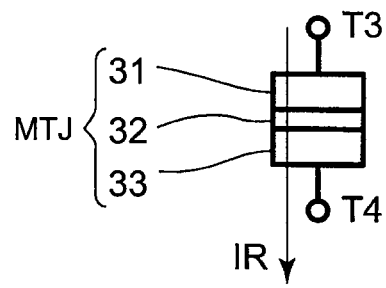
FIG. 5 is a conceptual diagram illustrating a data read operation with respect to the magnetic domain wall displacement element according to the first embodiment of this invention.

FIG. 5 is a conceptual diagram illustrating a read operation of the magnetic domain wall displacement element according to the first embodiment. Note that, for convenience of the description, the recording layer is not shown. At a time of data read, a read current IR is supplied between the terminal T3 and the terminal T4. As a result, the read current flows through the MTJ so as to pass through the tunnel barrier layer 32. The resistance value of the MTJ is detected based on the read current IR or a read voltage corresponding to the read current IR, and thus the magnetization direction of the reversal region is sensed.

(Initialization)

Figure 6A:
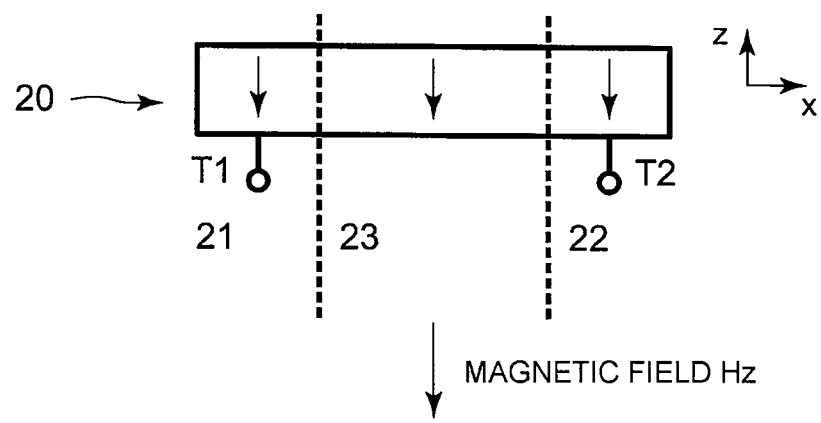
FIG. 6A is a conceptual diagram illustrating a first step of initialization processing with respect to the magnetic domain wall displacement element according to the first embodiment of this invention.
Figure 6B:
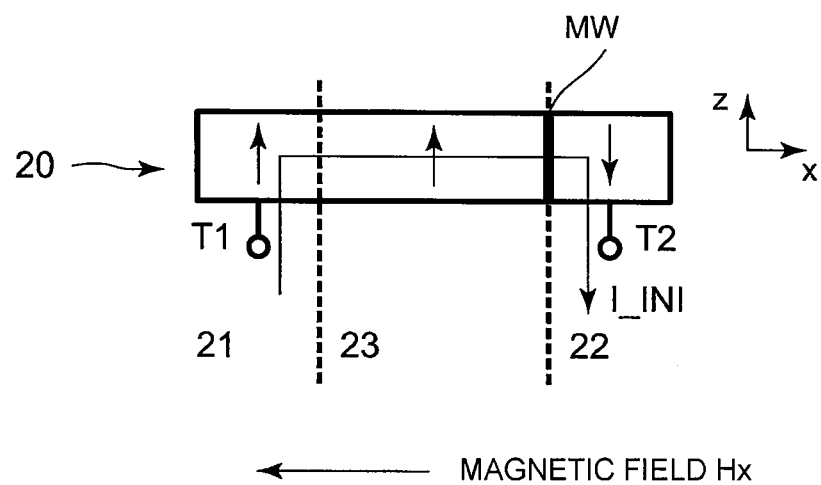
FIG. 6B is a conceptual diagram illustrating a second step of the initialization processing with respect to the magnetic domain wall displacement element according to the first embodiment of this invention.

FIGS. 6A and 6B are conceptual diagrams illustrating the initialization of the magnetic domain wall displacement element according to the first embodiment. Note that, for convenience of the description, the MTJ is not shown. The initialization of the magnetic domain wall displacement element according to the first embodiment employs the "magnetization reversal induced by an in-plane magnetic field and an in-plane current". It is assumed that current values at which the magnetization reversal occurs in the magnetization reversal region, the first fixed region, and the second fixed region at a certain in-plane magnetic field are I_INI_TH0, I_INI_TH1, and I_INI_TH2, respectively. In the first embodiment, the width in the Y-direction of the reversal region 23, the first fixed region 21, and the second fixed region 22 varies, and hence the current density of the respective regions varies. The width in the Y-direction of the reversal region 23 is the smallest, and hence the write current I_INI_TH0 required for reversing the magnetization of the reversal region 23 is the smallest. Next, the width in the Y-direction of the first fixed region 21 is the second smallest, and hence the write current I_INI_TH1 required for reversing the magnetization of the first fixed region 21 is the second smallest. Finally, the width in the Y-direction of the second fixed region 22 is the largest, and hence the write current I_INI_TH2 required for reversing the magnetization of the second fixed region 22 is the largest.

The initialization is performed through the following two steps.

FIG. 6A illustrates a first step. In the first step, an external magnetic field in the −Z-direction (third direction) is uniformly applied to the magnetic domain wall displacement element. Each magnetization of the reversal region 23, the first fixed region 21, and the second fixed region 22 is directed in the −Z-direction by setting the value of the external magnetic field to be larger than each retention force of the reversal region 23, the first fixed region 21, and the second fixed region 22.

FIG. 6B illustrates a second step. In the second step, an external magnetic field (first magnetic field component) in the −X-direction (direction parallel to the film surface of the recording layer) is uniformly applied to the magnetic domain wall displacement element. An initialization current I_INI (first current) to be supplied at a time of initialization flows from the terminal T1 to the terminal T2 through the recording layer 20. The initialization current I_INI is larger than the write current I_INI_TH0 required for reversing the magnetization of the reversal region 23 and the write current I_INI_TH1 required for reversing the magnetization of the first fixed region 21, and is smaller than the write current I_INI_TH2 required for reversing the magnetization of the second fixed region 22. In this case, each magnetization of the reversal region 23 and the first fixed region 21 is reversed into the +Z-direction due to the phenomenon of the "magnetization reversal induced by an in-plane magnetic field and an in-plane current". The first fixed region 21 and the reversal region 23 in which the magnetization reversal occurs may be referred to as a first region, and the second fixed region 22 in which the magnetization reversal does not occur may be referred to as a second region.

Note that, the initialization current I_INI can be designed so as to be larger than the write currents IW0 and IW1. Thus, the "magnetization reversal induced by an in-plane magnetic field and an in-plane current" can be designed so as not to occur at a time of data write.

Further, in the first embodiment, the initialization is performed through two steps or one step. However, a test may be conducted to determine whether or not the magnetic domain wall has actually been introduced, and the initialization current and the in-plane magnetic field may be applied to only the element graded as FAIL, in which the magnetic domain wall has not been introduced, so as to increase an initialization ratio. Note that, the initialization processing is assumed to be performed before shipment of a product, and hence the application of such a Verify test to the initialization does not lead to overhead of an operation speed of a magnetic random access memory after shipment in spite of prolonging the test time before shipment.

Further, in the first embodiment, the initialization current is larger than the write current, but it is not necessarily required to enlarge the size of a cell transistor so as to allow the initialization current to flow therethrough. In general, the cell transistor is designed so as to be supplied with the write current. However, at a time of the initialization processing before shipment, it is sufficient that a power supply voltage be increased so as to supply the initialization current to the cell transistor. Although the transistor is liable to be damaged when the power supply voltage is increased, a high voltage is applied to the transistor for a short period of time, that is, only at a time of initialization before shipment, and thus, the transistor can be easily designed so as not to be damaged with the power supply voltage.

As described above, in the first embodiment, the fixed layer for initialization can be made unnecessary in the magnetic domain wall displacement MRAM using the perpendicular magnetization film. Therefore, a manufacturing process can be simplified, and hence an inexpensive magnetic domain wall displacement MRAM can be provided. Further, the recording layer is prevented from being damaged by etching and the like, which occurs when the fixed layer is processed, and hence a highly reliable magnetic domain wall displacement MRAM can be provided. Further, there is no risk of the leakage magnetic field from the fixed layer increasing the write current value, and hence a magnetic domain wall displacement MRAM capable of being operated with low power can be provided.

Second Embodiment

Figure 7A:
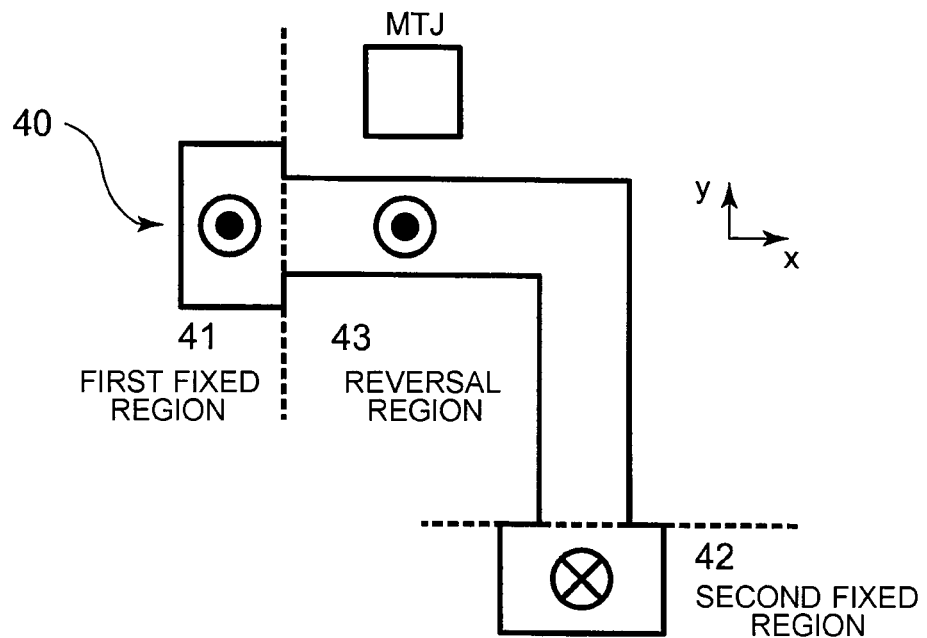
FIG. 7A is a plan view illustrating a configuration of a magnetic domain wall displacement element according to a second embodiment of this invention.
Figure 7B:
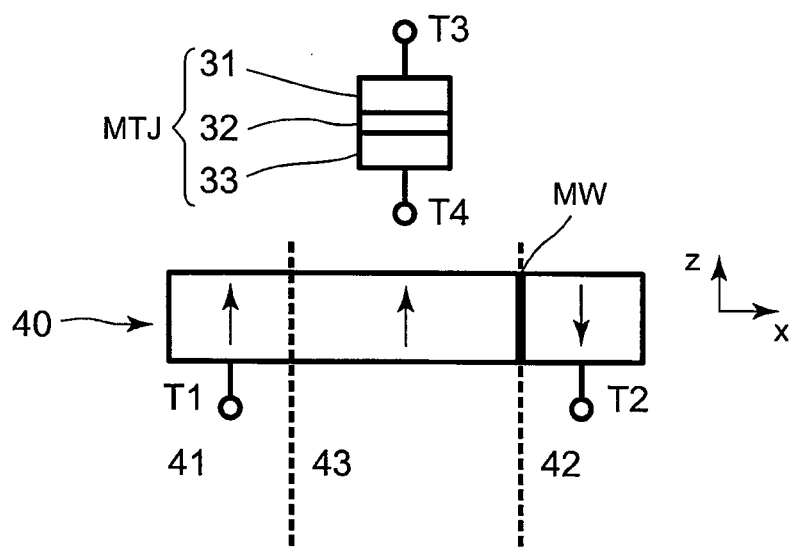
FIG. 7B is a vertical sectional view illustrating the configuration of the magnetic domain wall displacement element according to the second embodiment of this invention.

FIGS. 7A and 7B are respectively a schematic plan view and a schematic vertical sectional view of a magnetic domain wall displacement element according to a second embodiment of this invention. The magnetic domain wall displacement element according to the second embodiment is different from the first embodiment only in a planar structure. Therefore, the same components as those of the first embodiment are denoted by the same reference symbols as those therein, and the repeated descriptions thereof are appropriately omitted.

According to the second embodiment of this invention, as illustrated in FIG. 7A, in a planar shape of a recording layer 40, a first fixed region 41 and a part of a reversal region 43 extend in an X-axis direction, and a second fixed region 42 and the other part of the reversal region 43 extend in a Y-axis direction. Further, the width in the Y-axis direction of the first fixed region 41 and the width in the X-axis direction of the second fixed region 42 are larger than the width in the Y-axis direction of the reversal region 43 extending in the X-axis direction. Further, the width in the Y-axis direction of the first fixed region 41 and the width in the X-axis direction of the second fixed region 42 are substantially equal to each other.

Note that, in the same way as in the first embodiment, it can be said that the first fixed region 41, the second fixed region 42, and the reversal region 43 in the recording layer 40 have the same film configuration.

Also referring to FIG. 7B, it is assumed that a write current value required for the magnetic domain wall MW to be displaced in the reversal region 43 is IW_TH0, a write current value required for the magnetic domain wall MW to be displaced in the first fixed region 41 is IW_TH1, and a write current value required for the magnetic domain wall MW to be displaced in the second fixed region 42 is IW_TH2. In the second embodiment, the width of the reversal region 43 is the smallest, and hence the write current IW_TH0 required for driving the magnetic domain wall is the smallest. Next, the width of the first fixed region 41 and the width of the second fixed region 42 are substantially equal to each other and larger than the width of the reversal region 43. Therefore, the write currents IW_TH1 and IW_TH2 required for driving the magnetic domain wall are substantially equal to each other and larger than the write current IW_TH0. The magnetic domain wall can be displaced through use of a current in the reversal region 43 by setting a write current IW0 to be supplied for rewriting data "1" into data "0" and a write current IW1 to be supplied for rewriting the data "0" into the data "1" to values larger than the write current IW_TH0 and smaller than the write currents IW_TH1 and IW_TH2.

Figure 8:
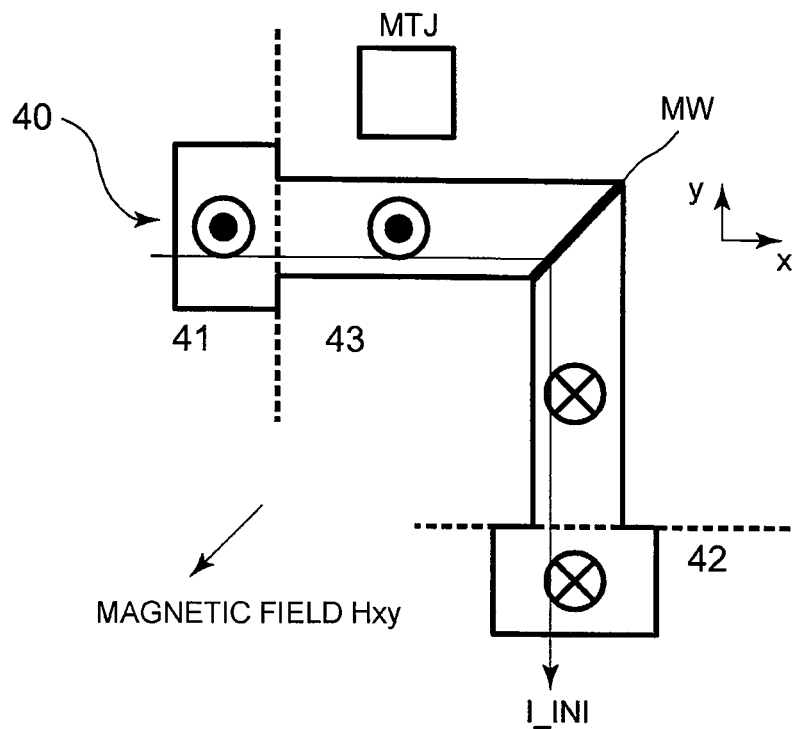
FIG. 8 is a conceptual diagram illustrating initialization processing with respect to the magnetic domain wall displacement element according to the second embodiment of this invention.

FIG. 8 is a conceptual diagram illustrating the initialization of the magnetic domain wall displacement element according to the second embodiment. The initialization of the magnetic domain wall displacement element according to the second embodiment employs the "magnetization reversal induced by an in-plane magnetic field and an in-plane current". It is assumed that current values at which the magnetization reversal occurs in the magnetization reversal region, the first fixed region, and the second fixed region at a certain in-plane magnetic field are I_INI_TH0, I_TNI_TH1, and I_INI_TH2, respectively. In the second embodiment, the width perpendicular to a current direction (direction denoted by the arrow line I_INI in FIG. 8) of the reversal region 43, the first fixed region 41, and the second fixed region 42 varies, and hence the current density of the respective regions varies. The width of the reversal region 43 is the smallest, and hence the write current I_INI_TH0 required for reversing the magnetization of the reversal region 43 is the smallest. Next, the width of the first fixed region 41 and the width of the second fixed region 42 are equally small. Therefore, the write current I_INI_TH1 required for reversing the magnetization of the first fixed region 41 and the write current I_INI_TH2 are substantially equal to each other, and are smallest next to the write current I_INI_TH0.

The initialization is performed in the following one step.

As illustrated in FIG. 8, the direction of an in-plane magnetic field to be applied to the magnetic domain wall displacement element at a time of initialization is a +135° direction with the clockwise direction from the X-axis being positive in an XY-plane. An initialization current I_INI is caused to flow in a direction of the first fixed region 41—reversal region 43—second fixed region 42. The initialization current I_INI is larger than the write current I_INI_TH0 required for reversing the magnetization of the reversal region 43, the write current I_INI_TH1 required for reversing the magnetization of the first fixed region 41, and the write current I_INI_TH2 required for reversing the magnetization of the second fixed region 42. In the "magnetization reversal induced by an in-plane magnetic field and an in-plane current", the magnetization is finally directed in a direction of ZXIXH, with a unit vector Z in a Z-direction, an in-plane magnetic field H, and an in-plane current I being respectively vectors. The X represents an outer product. In this case, ZXIXH=−(I·H)Z+(I·Z)H=−(I·H)Z is obtained, using a vector triple product formula and the fact that the in-plane current I is perpendicular to the unit vector Z, and thus the positive/negative sign of the Z-direction in which the magnetization is finally directed is determined from an inner product of the in-plane current I and the in-plane magnetic field H. Accordingly, in the first fixed region 41 and the region in which a part of the reversal region 43 extends in the X-axis direction, an inner product formed by the initialization current I_INI (second current) and Hxy (second magnetic field component) is negative, and hence the magnetization is finally directed in the +Z-direction. On the other hand, in the second fixed region 42 and the region in which the other part of the reversal region 43 extends in the Y-axis direction, an inner product formed by the initialization current I_INI (third current) and Hxy (third magnetic field component) is positive, and hence the magnetization is finally directed in the −Z-direction. As a result, the magnetic domain wall can be introduced into the reversal region 43. Further, the magnetization direction of the first fixed region 41 and that of the second fixed region 42 can be antiparallel to each other. In this case, it can be said that the magnetization reversal in a first direction is induced into a third region including the first fixed region 41 and the reversal region 43 extending in the X-axis direction, and the mag- netization reversal in a second direction antiparallel to the first direction is induced into a fourth region including the reversal region 43 extending in the Y-axis direction and the second fixed region 42. Note that, when the third direction described in the first embodiment is defined so as to be associated with the first and second directions, the third direction can be considered as a direction parallel to antiparallel to the first and second directions.

Note that, the initialization current I_INI can be designed so as to be larger than the write currents IW0 and IW1. Thus, the "magnetization reversal induced by an in-plane magnetic field and an in-plane current" can be designed so as not to occur at a time of data write.

Figure 9:
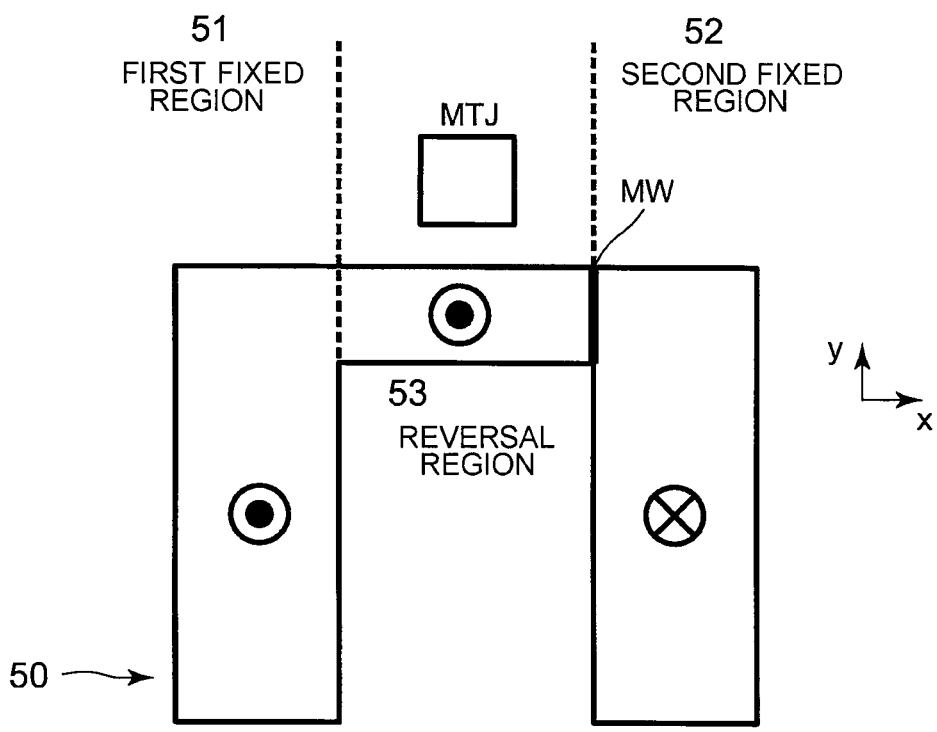
FIG. 9 is a plan view illustrating a configuration of a magnetic domain wall displacement element according to a modified example of the second embodiment of this invention.

FIG. 9 is a schematic plan view of a magnetic domain wall displacement element according to a modified example of the second embodiment. The magnetic domain wall displacement element according to the modified example of the second embodiment is different from the second embodiment only in a planar structure. Therefore, the same components as those of the second embodiment are denoted by the same reference symbols as those therein, and the repeated descriptions thereof are appropriately omitted.

According to the modified example, in a planar shape of a recording layer 50, a reversal region 53 extends in the X-axis direction, and a first fixed region 51 and a second fixed region 52 extend in the Y-axis direction. Further, the width in the X-axis direction of the first fixed region 51 and the width in the X-axis direction of the second fixed region 52 are larger than the width in the Y-axis direction of the reversal region 53. Further, the width in the X-axis direction of the first fixed region 51 and the width in the X-axis direction of the second fixed region 52 are substantially equal to each other.

It is assumed that a write current value required for the magnetic domain wall MW to be displaced in the reversal region 53 is IW_TH0, a write current value required for the magnetic domain wall MW to be displaced in the first fixed region 51 is IW_TH1, and a write current value required for the magnetic domain wall MW to be displaced in the second fixed region 52 is IW_TH2. In this modified example, the width of the reversal region 53 is the smallest, and hence the write current IW_TH0 required for driving the magnetic domain wall is the smallest. Next, the width of the first fixed region 51 and the width of the second fixed region 52 are substantially equal to each other and larger than the width of the reversal region 53. Therefore, the write currents IW_TH1 and IW_TH2 are substantially equal to each other and larger than the write current IW_TH0. The magnetic domain wall can be displaced through use of a current in the reversal region 53 by setting write currents IW0 and IW1 to values larger than the write current IW_TH0 and smaller than the write currents IW_TH1 and IW_TH2.

Figure 10:
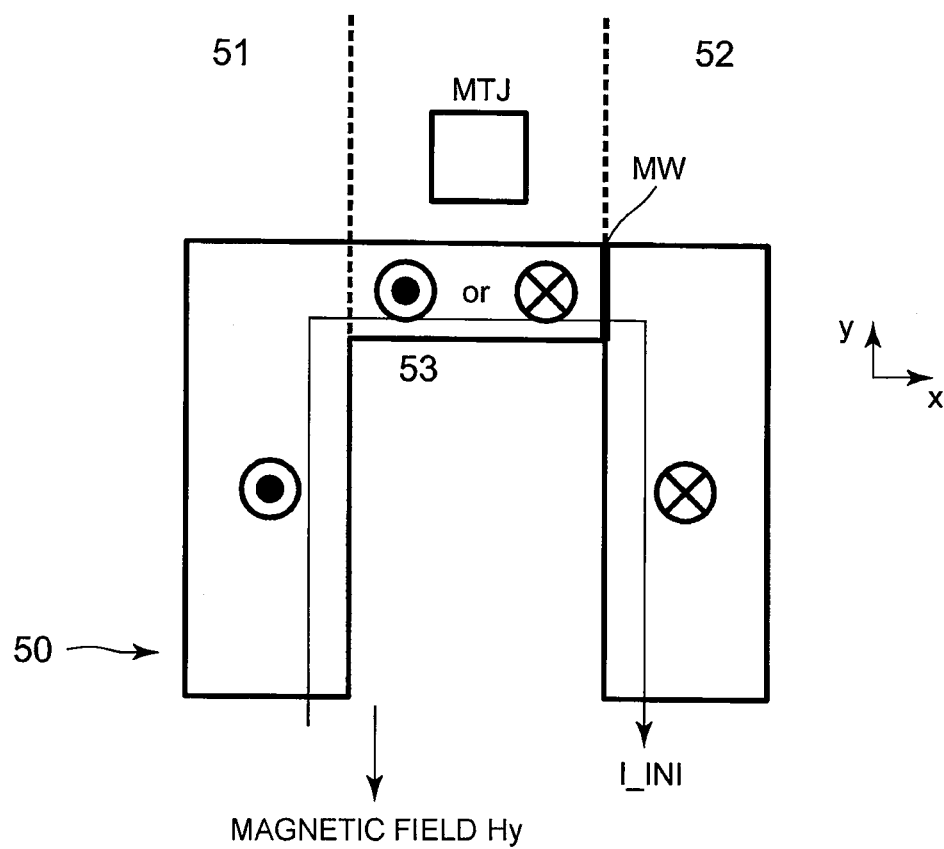
FIG. 10 is a conceptual diagram illustrating initialization processing with respect to the magnetic domain wall displacement element according to the modified example of the second embodiment of this invention.

FIG. 10 is a conceptual diagram illustrating the initialization of the magnetic domain wall displacement element according to the modified example of the second embodiment. The initialization is performed in the following one step. The initialization of the magnetic domain wall displacement element according to the modified example employs the "magnetization reversal induced by an in-plane magnetic field and an in-plane current". It is assumed that current values at which the magnetization reversal occurs in the magnetization reversal region, the first fixed region, and the second fixed region at a certain in-plane magnetic field are I_INI_TH0, I_TNI_TH1, and I_INI_TH2, respectively. In this modified example, the width perpendicular to a current direction (direction denoted by the arrow line I_INI in FIG. 10) of the reversal region 53, the first fixed region 51, and the second fixed region 52 varies, and hence the current density of the respective regions varies. The width of the reversal region 53 is the smallest, and hence the write current I_INI_TH0 required for reversing the magnetization of the reversal region 53 is the smallest. Next, the width of the first fixed region 51 and the width of the second fixed region 52 are equally small. Therefore, the write current I_INI_TH1 required for reversing the magnetization of the first fixed region 51 and the write current I_INI_TH2 are substantially equal to each other, and are smallest next to the write current I_INI_TH0.

As illustrated in FIG. 10, the direction of an in-plane magnetic field to be applied to the magnetic domain wall displacement element at a time of initialization is the −Y-direction. An initialization current I_INI is caused to flow in a direction of the first fixed region 51-reversal region 53-second fixed region 52. The initialization current I_INI is larger than the write current I_INI_TH0 required for reversing the magnetization of the first fixed region 51 and larger than the write current I_INI_TH2 required for reversing the magnetization of the second fixed region 52. In the "magnetization reversal induced by an in-plane magnetic field and an in-plane current", the magnetization is finally directed in a direction of ZXIXH, with a unit vector Z in a Z-direction, an in-plane magnetic field H, and an in-plane current I being respectively vectors. In this case, ZXIXH=−(I·H)Z+(I·Z)H=−(I·H)Z is obtained, using a vector triple product formula and the fact that the in-plane current I is perpendicular to the unit vector Z, and thus the positive/negative sign of the Z-direction in which the magnetization is finally directed is determined from an inner product of the current I and the magnetic field H. Accordingly, in the first fixed region 51, an inner product formed by the current I_INI and the magnetic field Hy is negative, and hence the magnetization is finally directed in the +Z-direction. On the other hand, in the second fixed region 52, an inner product formed by the current I_INI and the magnetic field Hy is positive, and hence the magnetization is finally directed in the −Z-direction. As a result, the magnetization direction of the first fixed region 51 and that of the second fixed region 52 can be antiparallel to each other.

As described above, according to the second embodiment and the modified example thereof, the fixed layer for initialization can be made unnecessary in the magnetic domain wall displacement MRAM using the perpendicular magnetization film. Therefore, a manufacturing process can be simplified, and hence an inexpensive magnetic domain wall displacement MRAM can be provided. Further, the recording layer is prevented from being damaged by etching and the like, which occurs when the fixed layer is processed, and hence a highly reliable magnetic domain wall displacement MRAM can be provided. Further, there is no risk of the leakage magnetic field from the fixed layer increasing the write current value, and hence a magnetic domain wall displacement MRAM capable of being operated with a low power can be provided. Further, compared to the first embodiment, the width perpendicular to a direction in which a current flows in the first fixed region may be substantially equal to that in the second fixed region, and hence a margin for the initialization current can be enlarged.

Next, aspects of the initialization processing preferred in the magnetic domain wall displacement MRAM according to the first and second embodiments are described blow.

(Aspect 1)

An initialization processing method for a magnetic domain wall displacement MRAM according to the first and second embodiments, including:

a first step of applying a magnetic field in a third direction parallel or antiparallel to a first direction and a second direction so as to direct magnetization of a fixed region in the third direction; and a second step of causing an in-plane current to flow in a direction parallel to a film surface of the recording layer and applying a magnetic field component in the direction parallel to the film surface of the recording layer.

(Aspect 2)

An initialization processing method according to Aspect 1, further including:

following the second step, a third step of conducting a test to determine whether or not a magnetic domain wall has been introduced, in which an element determined to have the magnetic domain wall introduced thereto is graded as PASS, and an element determined not to have the magnetic domain wall introduced thereto is graded as FAIL; and repeating the first step, the second step, and the third step with respect to only the element graded as FAIL in the third step.

(Aspect 3)

An initialization processing method according to Aspect 2, further including setting a power supply voltage to be high when supplying the in-plane current in the second step so as to enhance current supply capability of a transistor.

This invention has been described with reference to a plurality of the embodiments and the modified example. However, it is appreciated that this invention is not limited to each of the above-mentioned embodiments, and each embodiment may be appropriately modified or changed within the scope of the technical idea of this invention. For example, in the above-mentioned embodiments, the write threshold current and the initialization threshold current are set based on the difference in width between the reversal region and the fixed region. However, the write threshold current and the initialization threshold current may be controlled based on the difference in thickness direction (Z-direction) instead of the width direction. In the case where the difference in thickness direction is applied to the first embodiment, the thickness of the second fixed region 22 is set to be larger than that of the first fixed region 21.

Further, in the above-mentioned embodiments, the write threshold current is set based on the difference in width between the reversal region and the fixed region so as to suppress the entry of the magnetic domain wall into the fixed region at a time of write. However, the entry of the magnetic domain wall into the fixed region may be suppressed by making the morphology of an underlying surface of the fixed region different from that of the reversal region. Further, in the case of suppressing the entry of the magnetic domain wall into the fixed region through use of the morphology, the width direction or the thickness direction of the fixed region may be set to be the same as that of the reversal region without changing the current density of the reversal region and the fixed region.

Further, in the above-mentioned embodiments, the magnetic domain wall is held in a thermally stable manner through use of an infinite number of pinning sites in the material having perpendicular magnetic anisotropy. However, a difference in level may be formed between the fixed region and the reversal region so as to further enhance thermal stability.

Further, in the above-mentioned embodiments, the MTJ is formed at a position that is physically away from the reversal region. However, the magnetization of the reversal region may read by forming the tunnel barrier film in contact with the reversal region and further forming the reference layer having perpendicular magnetic anisotropy on a side of the tunnel barrier film opposite to the reversal region.

Further, in the above-mentioned embodiments, the in-plane magnetic field is applied to the magnetic domain wall displacement element from outside. However, a magnetic field may be used, which is generated by forming wiring in the vicinity of the magnetic domain wall displacement element and causing a current to flow through the wiring. Further, the "magnetization reversal induced by an in-plane magnetic field and an in-plane current" may be caused only in the first fixed region by forming wiring in the vicinity of the first fixed region and causing a current to flow through the wiring. Further, the direction of reversal caused by the "magnetization reversal induced by an in-plane magnetic field and an in-plane current" in the first fixed region may be set to be antiparallel to that in the second fixed region by forming first wiring in the vicinity of the first fixed region, forming second wiring in the second fixed region, and controlling the directions of currents flowing through the first wiring and the second wiring.

Further, the above-mentioned embodiments are applied to a memory cell of a magnetic random access memory. However, this technology may be applied to write of a spin-polarized region of other magnetic domain wall displacement memories such as a racetrack memory.

This application is based on and claims the benefit of priority from Japanese Patent Application No. 2012-235763, filed on Oct. 25, 2012, the disclosure of which is incorporated herein by reference in its entity.

REFERENCE SIGNS LIST 11, 21, 41, 51 first fixed region
12, 22, 42, 52 second fixed region
13, 23, 43, 53 reversal region

The invention claimed is:

1. A magnetic wall displacement type memory cell, comprising a recording layer comprising a magnetic film,
   the recording layer comprising:
      a magnetization reversal region in which magnetization is reversible; and
      at least two magnetization fixed regions that supply a spin-polarized electron to the magnetization reversal region,
   wherein the magnetic wall displacement type memory cell is configured so that a first region in which magnetization reversal occurs due to a first current flowing in a direction parallel to a film surface of the recording layer and a first magnetic field component in the direction parallel to the film surface of the recording layer is formed, and a second region in which no magnetization reversal occurs is formed.

2. A magnetic wall displacement type memory cell according to claim 1, wherein the first region has current density higher than current density of the second region.

3. A magnetic wall displacement type memory cell according to claim 2, wherein the second region is larger than the first region in a width in a film in-plane direction perpendicular to the direction of the first current.

4. A magnetic wall displacement type memory cell according to claim 2, wherein the second region is larger than the first region in a thickness in a direction perpendicular to the film surface and perpendicular to the direction of the first current.

5. A magnetic wall displacement type memory cell according to claim 1, wherein the first current introduces a magnetic wall into the recording layer, and the magnetic wall is displaced through use of a write current that is smaller than the first current.

6. A magnetic wall displacement type memory cell according to claim 1, wherein the first region and the second region have the same film configuration.

7. An initialization processing method for the magnetic wall displacement type memory cell of claim 1, comprising:
   a first step of applying a magnetic field in a third direction so as to direct magnetization of a fixed region in the third direction; and
   a second step of causing an in-plane current to flow in the direction parallel to the film surface of the recording layer and applying a magnetic field component in the direction parallel to the film surface of the recording layer.

8. An initialization processing method for the magnetic wall displacement type memory cell according to claim 7, further comprising:
   following the second step,
   a third step of conducting a test to determine whether or not a magnetic wall has been introduced, in which an element determined to have the magnetic wall introduced thereto is graded as PASS, and an element determined not to have the magnetic wall introduced thereto is graded as FAIL; and
   repeating the first step, the second step, and the third step with respect to only the element graded as FAIL in the third step.

9. An initialization processing method for the magnetic wall displacement type memory cell according to claim 7, further comprising setting a power supply voltage to be high when supplying the in-plane current in the second step so as to enhance current supply capability of a transistor.

10. A magnetic wall displacement type memory cell, comprising a recording layer comprising a magnetic film,
    the recording layer comprising:
       a magnetization reversal region in which magnetization is reversible; and
       at least two magnetization fixed regions that supply a spin-polarized electron to the magnetization reversal region,
    wherein the magnetic wall displacement type memory cell is configured so that:
       magnetization reversal in a first direction is induced into a third region due to a second current flowing in a direction parallel to a film surface of the magnetic film and a second magnetic field component in the direction parallel to the film surface of the magnetic film; and
       magnetization reversal in a second direction that is antiparallel to the first direction is induced into a fourth region due to a third current flowing in the direction parallel to the film surface of the magnetic film and a third magnetic field component in the direction parallel to the film surface of the magnetic film.

11. A magnetic wall displacement type memory cell according to claim 10, wherein the second current and the second magnetic field component form an inner product having a positive/negative sign different from a positive/negative sign of an inner product of the third current and the third magnetic field component.

12. A magnetic wall displacement type memory cell according to claim 10, wherein the direction of the second current parallel to the film surface of the magnetic film is different from the direction of the third current parallel to the film surface of the magnetic film.

13. A magnetic wall displacement type memory cell according to claim 10, wherein the second current and the third current introduce a magnetic wall into the recording layer, and the magnetic wall is displaced through use of a write current that is smaller than the second current and the third current.

14. A magnetic wall displacement type memory cell according to claim 10, wherein the third region and the fourth region have the same film configuration.

15. An initialization processing method for the magnetic wall displacement type memory cell of claim 10, comprising:
   a step of causing an in-plane current to flow in the direction parallel to the film surface of the recording layer and applying a magnetic field component in the direction parallel to the film surface of the recording layer.

16. An initialization processing method for the magnetic wall displacement type memory cell according to claim 15, further comprising:
   following the second step,
   a third step of conducting a test to determine whether or not a magnetic wall has been introduced, in which an element determined to have the magnetic wall introduced thereto is graded as PASS, and an element determined not to have the magnetic wall introduced thereto is graded as FAIL; and
   repeating the first step, the second step, and the third step with respect to only the element graded as FAIL in the third step.

17. An initialization processing method for the magnetic wall displacement type memory cell according to claim 15, further comprising setting a power supply voltage to be high when supplying the in-plane current in the second step so as to enhance current supply capability of a transistor.

* * * * *